US008421006B2

(12) United States Patent
Naqwi et al.

(10) Patent No.: US 8,421,006 B2
(45) Date of Patent: Apr. 16, 2013

(54) SYSTEM AND METHOD FOR GENERATING SPRAYS USING ELECTRICAL FIELDS

(75) Inventors: Amir A. Naqwi, Eden Prairie, MN (US); Christopher W. Fandrey, Minneapolis, MN (US); Zeeshan H. Syedain, Minneapolis, MN (US)

(73) Assignee: MSP Corporation, Shoreview, MN (US)

( * ) Notice: Subject to any disclaimer, the term of this patent is extended or adjusted under 35 U.S.C. 154(b) by 282 days.

(21) Appl. No.: 12/942,164

(22) Filed: Nov. 9, 2010

(65) Prior Publication Data

US 2011/0108723 A1 May 12, 2011

Related U.S. Application Data

(60) Provisional application No. 61/260,831, filed on Nov. 12, 2009.

(51) Int. Cl.
*G01N 23/05* (2006.01)
*H01L 21/20* (2006.01)
*H01L 21/31* (2006.01)

(52) U.S. Cl.
USPC ........... 250/288; 977/840; 977/880; 977/890; 977/900; 977/901; 438/458; 438/472; 438/479; 438/480; 438/481; 438/482; 438/483; 438/484

(58) Field of Classification Search .................. 250/288; 977/840, 880, 890, 900, 901; 457/458, 472, 457/479, 480, 481, 482, 483, 484; 438/458, 438/472, 479, 480, 481, 482, 483, 484
See application file for complete search history.

(56) References Cited

U.S. PATENT DOCUMENTS

| | | | | |
|---|---|---|---|---|
| 5,247,842 | A | 9/1993 | Kaufman et al. | |
| 7,776,405 | B2 | 8/2010 | Bailey et al. | |
| 2007/0197044 | A1 * | 8/2007 | Jacobson et al. | 438/758 |
| 2010/0000304 | A1 * | 1/2010 | Kim et al. | 73/64.56 |

OTHER PUBLICATIONS

Camelot, D.; Marijnissen, J. C. M. and Scarlett, B. "Bipolar Coagulation Process for the Production of Powders," Ind. Eng. Chem. Res. 1999, vol. 38, 631-638.

Zeleny, J. "The Electrical Discharge from Liquid Points, and a Hydrostatic Method of Measuring the Electric Intensity at their Surfaces," The Physical Review 1914, vol. III, No. 2, 69-91.

* cited by examiner

*Primary Examiner* — Nicole Ippolito
(74) *Attorney, Agent, or Firm* — Brian R. Morrison; Westman, Champlin & Kelly, P.A.

(57) ABSTRACT

A device for generating sprays of charged droplets, and resulting nanoparticles, the device comprising a first needle connected to an electrical potential line to generate a first spray of charged particles from the first needle, and a second needle spaced apart from and facing the first needle, and connected to an electrical line configured to ground the second needle or to apply a voltage to the second needle that is the same polarity as the voltage applied to the first needle. The device also comprising an electric field modifier connected to the first needle, and configured to modify an electrical field to generate a second spray of charged particles from the second needle.

20 Claims, 5 Drawing Sheets

SYSTEM AND METHOD FOR GENERATING SPRAYS USING ELECTRICAL FIELDS

CROSS-REFERENCE TO RELATED APPLICATION(S)

The present application claims priority to U.S. Provisional Patent Application No. 61/260,831, filed on Nov. 12, 2009, and entitled "GENERATION OF FINE MIST USING ELECTRICAL FIELDS", the disclosure of which is incorporated by reference in its entirety.

STATEMENT OF GOVERNMENT INTEREST

This invention was made with government support under Contract No. R44EY016229 awarded by the National Eye Institute, National Institutes of Health; and Contract No. R44HL081789 awarded by the National Heart, Lung and Blood Institute, National Institutes of Health. The government has certain rights in the invention.

BACKGROUND

The present disclosure is directed to electrospraying devices and processes. In particular, the present disclosure is directed to electrospraying devices and processes for generating coagulation-based neutralized droplets and resulting nanoparticles.

Electrospraying involves applying a high electrical potential to a liquid-filled needle, which results in the formation of a liquid cone at the tip of the needle. A fine liquid jet emerges from the tip of the liquid cone and breaks up into fine droplets. Electrosprayed droplets are typically highly charged and unstable. Some of the applications require neutralization of the electrosprayed droplets. Original attempts to neutralize the droplets were based on ion producing means, including radioactive materials, corona discharge source and photon ionization source.

For example, as shown in FIG. 1, a conventional electrospray device 10 includes needle 12 supplied with a liquid 14 that flows in the direction of arrow 16. An electrical potential 18 is applied to liquid 14, which forms liquid cone 20 at the tip of needle 12. A liquid jet 22 emerges from the tip of liquid cone 20 and breaks up into fine droplets. The droplets carry a high electric charge of the same polarity as the electric potential (i.e. the droplets are positively charged if electric potential 18 is positive, and vice versa). Since the droplets have the same polarity of charge, they repel each other and spread out to form spray 24, which moves toward an electrically ground surface 26. As the liquid evaporates, these droplets often shed off finer droplets to remain stable. As such, electrospray is a useful device for many applications.

However, a number of important applications require neutralization of the droplets, so they are stabilized. One technique for neutralizing the droplets involves an ionization-based neutralization process. However, this process has an efficiency of about 10% and results in a host of problems, such as radiation safety and ozone generation. An alternative technique to overcome these problems involves a coagulation-based neutralization, which involved two oppositely charged electrosprays, created by opposite electrical potentials.

SUMMARY

A first aspect of the present disclosure is directed to a device for generating sprays of charged droplets. The device includes a first needle connected to an electrical potential line, where the electrical potential line is configured to apply a first voltage to the first needle to generate a first spray of charged particles from the first needle, and where the charged particles of the first spray have a first polarity. The device also includes a second needle spaced apart from and facing the first needle, the second needle being connected to an electrical line configured to ground the second needle or to apply a second voltage to the second needle that is the same polarity as the first voltage. The device further includes an electric field modifier connected to the first needle, the electric field modifier being configured to modify a generated electrical field produced by the applied voltage to generate a second spray of charged particles from the second needle, where the charged particles of the second spray have a second polarity that is opposite of the first polarity.

Another aspect of the present disclosure is directed to a device for generating sprays of charged droplets, where the device includes a first needle having a first inlet end configured to receive a first liquid, and a first tip opposite of the first inlet end, and an electrical potential line configured to apply a voltage to the first needle. The device also includes a metallic plate connected to the first needle at an offset distance from the first tip ranging from about 2 millimeters to about 15 millimeters. The device further includes a second needle having a second inlet end configured to receive a second liquid, and a second tip opposite of the second inlet end, the second tip of the second needle being spaced apart and facing the first tip of the first needle, and an electrical ground line configured to electrically ground the second needle.

Another aspect of the present disclosure is directed to a method for generating nanoparticles. The method includes applying a voltage to a first needle to generate a first spray of charged droplets from the first needle, where the charged droplets of the first spray have a first polarity. The method also includes electrically grounding a second needle while applying the voltage to the first needle, the second needle being spaced apart from and facing the first needle. The method further includes modifying an electrical field around the grounded second needle to generate a second spray of charged droplets from the grounded second needle, where the charged droplets of the second spray have a second polarity that is opposite of the first polarity. The method further includes neutralizing the charged droplets of the first spray and the second spray to form neutralized droplets, and evaporating a solvent from the neutralized droplets to provide the nanoparticles.

DETAILED DESCRIPTION

The present disclosure is directed to an electrospray device configured to generate coagulation-based neutralized droplets, which eliminates the use of opposite electrical potential in coagulation-based neutralization. Instead, as discussed below, the electrospray device incorporates an electrical potential and an electric field modifier to generate a fine mist spray of neutralized droplets that may be dried into solid nanoparticles. The electric field modifier enables the use of a single electrical potential (positive or negative) to generate oppositely charged droplets. This reduces the complexity and cost of the neutralization process.

Figure 2:
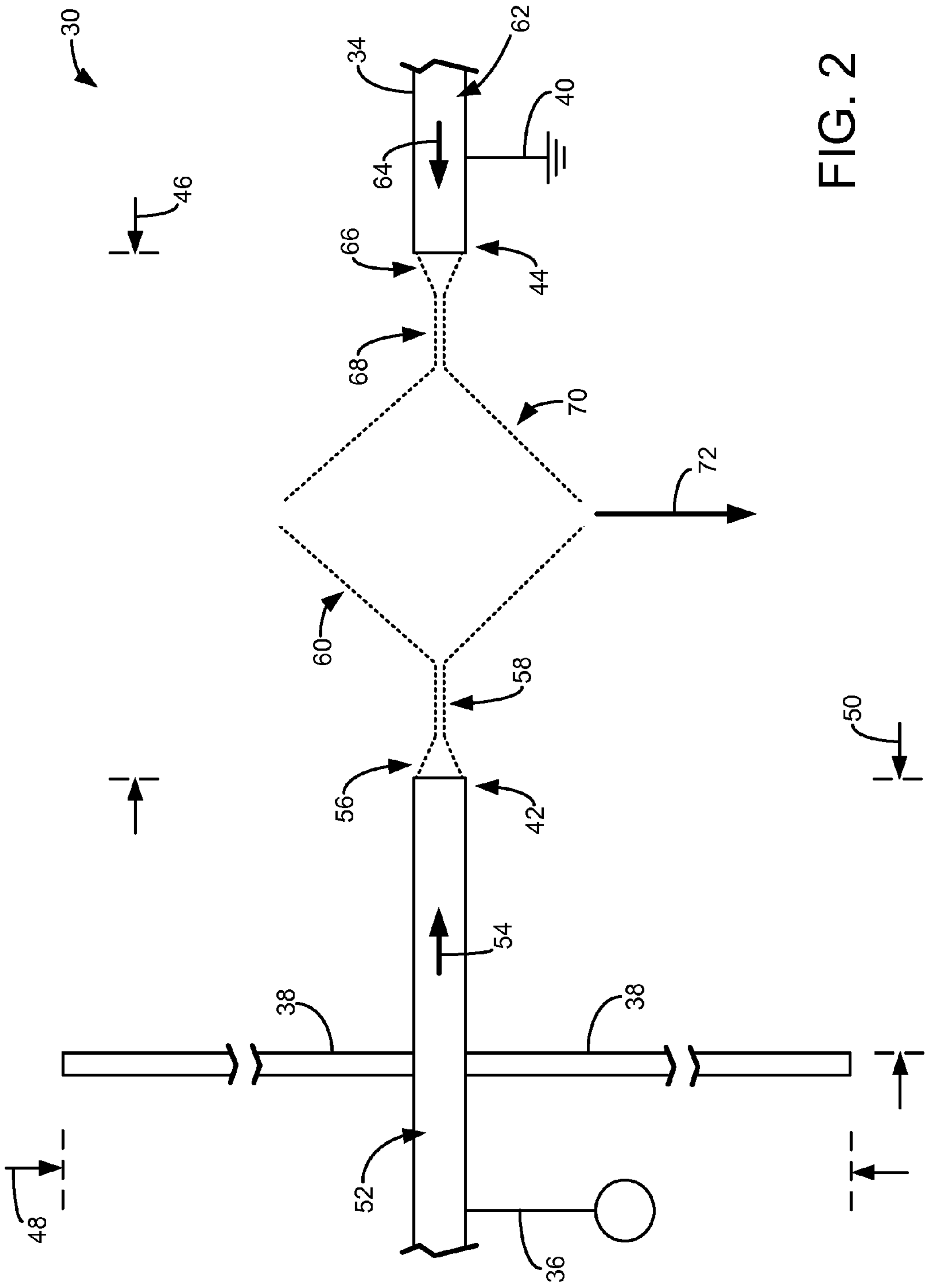
FIG. 2 is a side schematic illustration of a first embodiment of an electrospray device of the present disclosure.

As shown in FIG. 2, device 30 of the present disclosure is an electrospray device configured to produce coagulation-based neutralized droplets. Device 30 includes needles 32 and 34, electrical potential line 36, electric field modifier 38, and ground line 40. Needles 32 and 34 are opposing needles having tips 42 and 44, respectively, which face each other. Examples of suitable needles for needles 32 and 34 include needles derived from electrically-conductive materials (e.g., stainless-steel). Tips 42 and 44 are offset from each by distance 46, which may range from about 2 millimeters to about 20 millimeters, with particularly suitable distances for distance 46 ranging from about 5 millimeters to about 10 millimeters.

Electrical potential line 36 and ground line 40 are conventional electrical connections, where electrical potential line 36 is connected to needle 32, and ground line 40 is connected to needle 34. As discussed below, electrical potential line 36 is configured to apply a voltage to needle 32 having a given polarity (either positive or negative). Ground line 40 is an electrical line configured to ground needle 34. In an alternative embodiment, ground line 40 may be replaced with a second electrical line that is configured to apply a voltage to needle 34 having the same polarity as the voltage applied to needle 32 by electrical potential line 36. In this alternative embodiment, the voltage applied to needle 34 is desirably small (e.g., only a few volts) compared to the higher voltage applied to needle 32. Accordingly, in either alternative embodiment, needle 34 desirably does not receive a voltage that is opposite in polarity to the voltage applied to needle 32 by electrical potential line 36.

Electric field modifier 38 is a metallic plate (e.g., stainless steel plate) connected to needle 32. In one embodiment, electric field modifier 38 is an annular plate or disk, having average outer diameter 48, which may range from about 10 millimeters to about 50 millimeters, with particularly suitable average diameters for outer diameter 48 ranging from about 20 millimeters to about 40 millimeters. In alternative embodiments, electric field modifier 38 may be non-annular (e.g., oval, rectangular, and the like). In these embodiments, suitable cross-sectional areas for electric field modifier 38 include those corresponding to the above-discussed average outer diameters, with the dimensions of needle 32 removed.

Electric field modifier 38 is offset from tip 42 of needle 32 by offset distance 50, which is desirably selected to obtain a liquid cone at each of tips 42 and 44. If offset distance 50 is too short, electric field modifier 38 may induce a liquid cone at tip 44 of needle 34, but may disrupt the liquid cone at tip 42 of needle 32. Alternatively, if offset distance 50 is too large, electric field modifier 38 may not have enough influence on needle 34 to induce a liquid cone. Accordingly, suitable average distances for offset distance 50 range from about 2 millimeters to about 15 millimeters, with particularly suitable average distances for offset distance 50 range from about 5 millimeters to about 10 millimeters.

During operation, a voltage is applied to needle 32 by electrical potential line 36. The electrical potential draws liquid 52, which is a first electrically-conductive liquid, through needle 32 in the direction of arrow 54 toward tip 42. After exiting tip 42, liquid 52 forms liquid cone 56, leading to liquid jet 58. As discussed above, since the droplets of liquid jet 58 have the same polarity of charge, the droplets repel each other and spread out to form spray 60.

As further shown, needle 34 is grounded with ground line 40, and does not receive a voltage through ground line 40 that is opposite in polarity to the voltage applied to needle 32 by electrical potential line 36. As such, in a conventional electrospray device, an electrically-conductive liquid in needle 34 would not generate a spray corresponding to spray 60 from needle 32. Rather, the liquid would merely drip out of tip 44 of needle 34. Electric field modifier 38 connected to needle 34, however, modifies an electrical field between and around needles 32 and 34. The modified electrical field generates a spray of a second electrically-conductive liquid with an electric charge opposite to that of the droplets of spray 60.

In particular, electric field modifier 38 generates an electrical potential in needle 34 that is opposite in polarity from the charge induced to needle 32 from electrical potential line 36. This electrical potential in needle 34 draws liquid 62, which is a second electrically-conductive liquid, through needle 34 in the direction of arrow 64 toward tip 44. After exiting tip 44, liquid 62 forms liquid cone 66, leading to liquid jet 68. Since the droplets of liquid jet 68 have the same polarity of charge (opposite of that of the droplets of spray 60), the droplets repel each other and spread out to form spray 70.

Sprays 60 and 70 are directed toward each other. As such, the droplets from sprays 60 and 70 undergo a coagulation process and generate neutralized droplets. Liquid flow through needles 32 and 34 is typically in microliters per hour to milliliters per hour, and may be maintained by syringe pumps or gravitational hydrostatic force. A gas flow (e.g., in hundreds of milliliters per minute) may be used to carry the neutralized droplets downward in the direction of arrow 72, where the neutralized droplets may dry out quickly to produce solid particles in the average size range of about 10 nanometers to about 100 nanometers, with particularly suitable particles having average sizes ranging from about 10 nanometers to about 50 nanometers.

Accordingly, device 10 may generate nanometer size aerosols of therapeutic agents, which are ideal for animal testing and in some cases for human delivery. However, applications of device 10 are not limited to drug delivery. Rather, device 10 may be used for generation of nanoparticles, nanodroplets, and nanofibers for a variety of applications.

Figure 1:
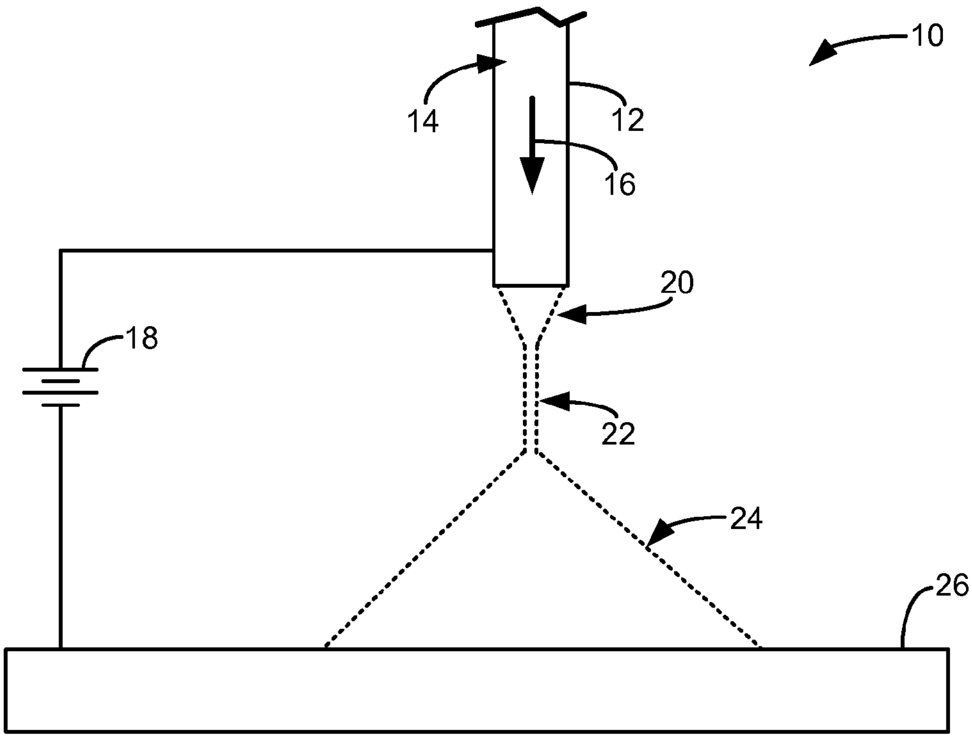
FIG. 1 (Prior Art)
FIG. 1 is a side schematic illustration of a prior art electrospray device.

Classical electrospray operations without neutralization, as discussed above for device 10 in FIG. 1, have valuable applications. For example, such operations may be used to ionize macromolecules (such as proteins) for mass spectroscopy. In this function, a solution of macromolecules is electrosprayed, and charged macromolecules are ejected from the droplets and carried over to mass spectroscopy instrument. In another application, a polymer solution is used and spray conditions are such that the solvent evaporates early and a charged solid filament is formed, instead of the droplets. The filament (or nanofiber) undergoes a whipping motion and deposits on the ground surface. This process is suitable for making webs of nanofibers that are used in filtration and in several emerging medical technologies.

However, neutralization of electrosprayed droplets is suitable for a variety of applications where charge-induced instability is undesirable. Neutralization enables generation of fine liquid mist (consisting of submicron droplets), which may be difficult to generate with other nebulization techniques. Furthermore, fine mists can be used in medical treatments, such as inhalation therapy. For example, if the liquids used in the electrospray are volatile, and one of them includes a non-volatile component, then the end product after evaporation of the volatile liquids is a suspension of solid nanoparticles. These solid nanoparticles can also be used as therapeutic agents. Nanoparticle suspensions are desirable for testing the efficacy and toxicity of inhaled substances in rodent models of pulmonary diseases and complications. On a larger scale of manufacturing, the nanoparticle generation may be used to make structured materials. Nanofibers with novel structural features can be manufactured using electrosprayed polymers with different levels of neutralization.

Figure 3:
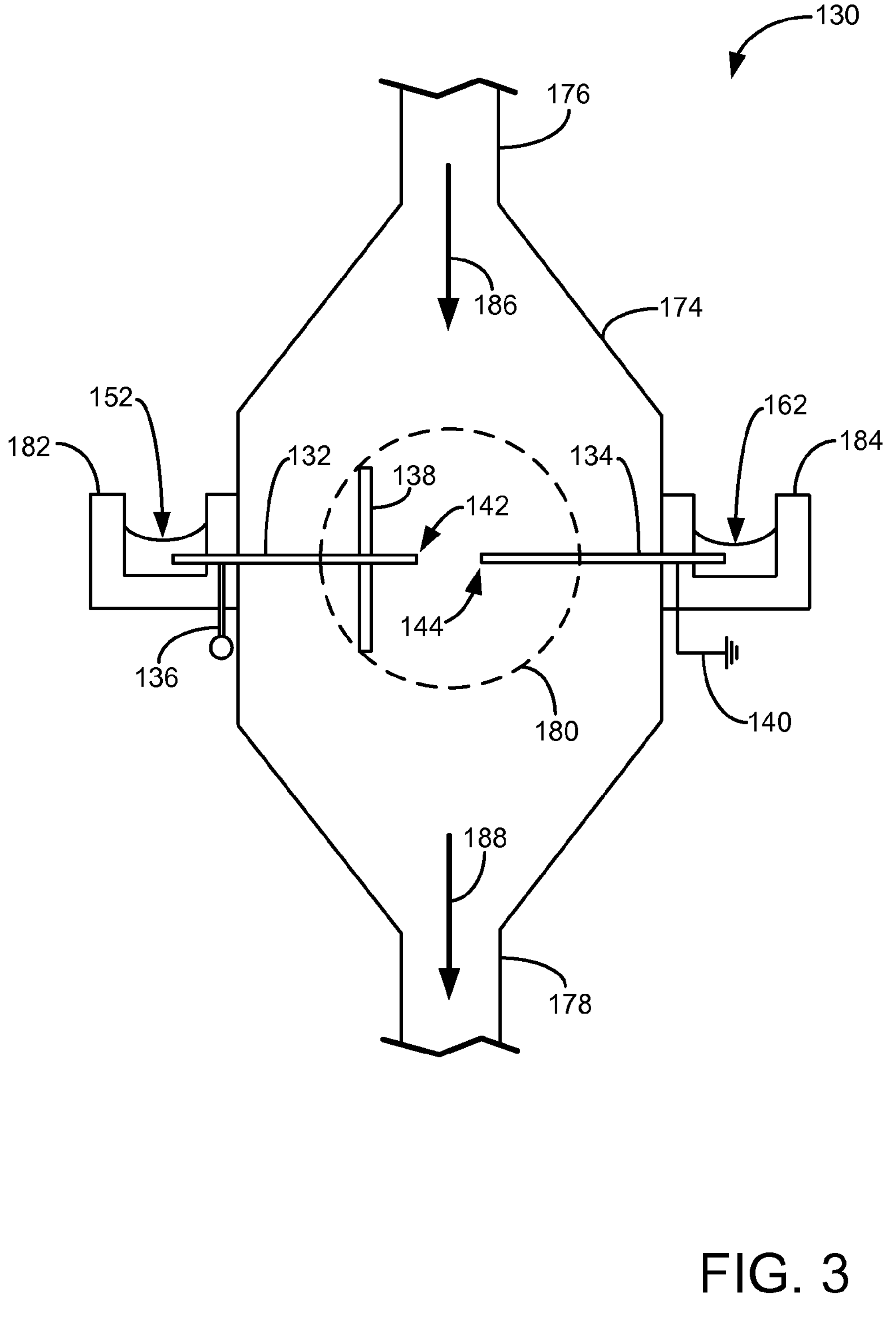
FIG. 3 is a side schematic illustration of a second embodiment of an electrospray device of the present disclosure.

FIG. 3 illustrates device 130, which is an alternative to device 30 (shown in FIG. 2), and where the respective references labels are increased by "100". As shown in FIG. 3, device 130 includes housing 174, which intersect inlet line 176 and outlet line 178. Housing 174 provides a safe enclosure for operating device 130, and all electrical connectors (e.g., electrical potential line 136 and ground line 140) are desirably rated for high voltage. Housing 174 also includes viewport 180, which may include a magnification lens so the operation of device 130 may be visually monitored without requiring the use of a video camera.

Device 130 also includes reservoirs 182 and 184, which are liquid reservoirs configured to supply the conductive liquids (e.g., liquids 152 and 162) to the inlet ends of needles 132 and 134, respectively. A variety of different liquids 152 and 162 may be supplied in reservoirs 182 and 184. In one embodiment, liquids 152 and 162 may each be pure, electrically-conductive liquids, such as organic solvents (e.g., ethanol, acetone, and the like, whose conductivity may be controlled by addition of trace amount of an acid, such as hydrochloric acid), aqueous liquids (e.g., water), and combinations thereof. In applications for generating solid nanoaerosols, at least one of liquids 152 and 162 contains an electrically-conductive solution having a non-volatile solute.

The desired liquid flow from reservoirs 182 and 184 to needles 132 and 134 may be accomplished by maintaining the liquid surfaces in reservoirs 182 and 184 at appropriate levels. As such, liquids 152 and 162 may flow to needles 132 and 134 by gravitational hydrostatic force. Alternatively, active feeding mechanisms (not shown) may be used, such as syringe pumps. Liquid reservoirs 182 and 184 are also desirably covered during operation to prevent the loss of liquids 152 and 162 by evaporation.

During operation, a gas is introduced through inlet line 176 in the direction of arrow 186, which flows across tips 142 and 144, and facilitates the carrying of the aerosols away from the region between needles 132 and 134. A high voltage may then be applied to needle 132 by electrical potential line 136. This draws liquid 152 from the inlet end of needle 132 toward tip 142, and ejects liquid 152 as a spray having droplets with a first polarity. As discussed above, needle 134 is grounded and does not directly receive voltage from an electrical potential source. Instead, electric field modifier 138 generates an electrical potential in needle 134, which draws liquid 162 from the inlet end of needle 134 toward tip 144, and ejects liquid 162 as a spray having droplets with a second polarity that is opposite of the first polarity.

The resulting sprays are directed toward each other, and the droplets from the sprays undergo a coagulation process and generate neutralized droplets. The gas flow in the direction of arrow 186 carry the resulting aerosols away from the region between needles 132 and 134 to outlet line 178 (as represented by arrow 188). As discussed above, the neutralized droplets may dry out quickly to produce solid nanoparticles. The evaporated solvents typically constitute no more than a small fraction of the overall gas flow (e.g., 10 parts per million), and typically do not affect the quality of the output of device 130. However, if solvent vapors are undesirable, device 130 may also include a scrubber (not shown), such as a column of activated carbon to remove the solvent vapors from the gas flow.

In some embodiments, liquids 152 and 162 may consist essentially of water, or may incorporate water as a carrier medium for a solution. However, water has a significantly higher surface tension compared to many organic solvents, and the electric potential required to create an aqueous cone is often higher than the dielectric strength of air, so arcing between the needles may occur without the formation of liquid cones. This may be resolved by introducing another gas to air having a higher dielectric constant, such as carbon dioxide and hydrofluoroalkanes. For inhalation experiments, however, it is less desirable to add a significant amount of other gases to air. The amount of additional gases may be minimized by directing the additional gases only to the needle tips instead of including the additional gases in bulk gas flow.

Once the sprays are started, they may continue for a duration of about 30 minutes to about 60 minutes without substantial changes in the output. The liquid consumed may be replenished by adding a drop of liquid to each reservoir 182 and 184 every 20 to 60 minutes.

Figure 4:
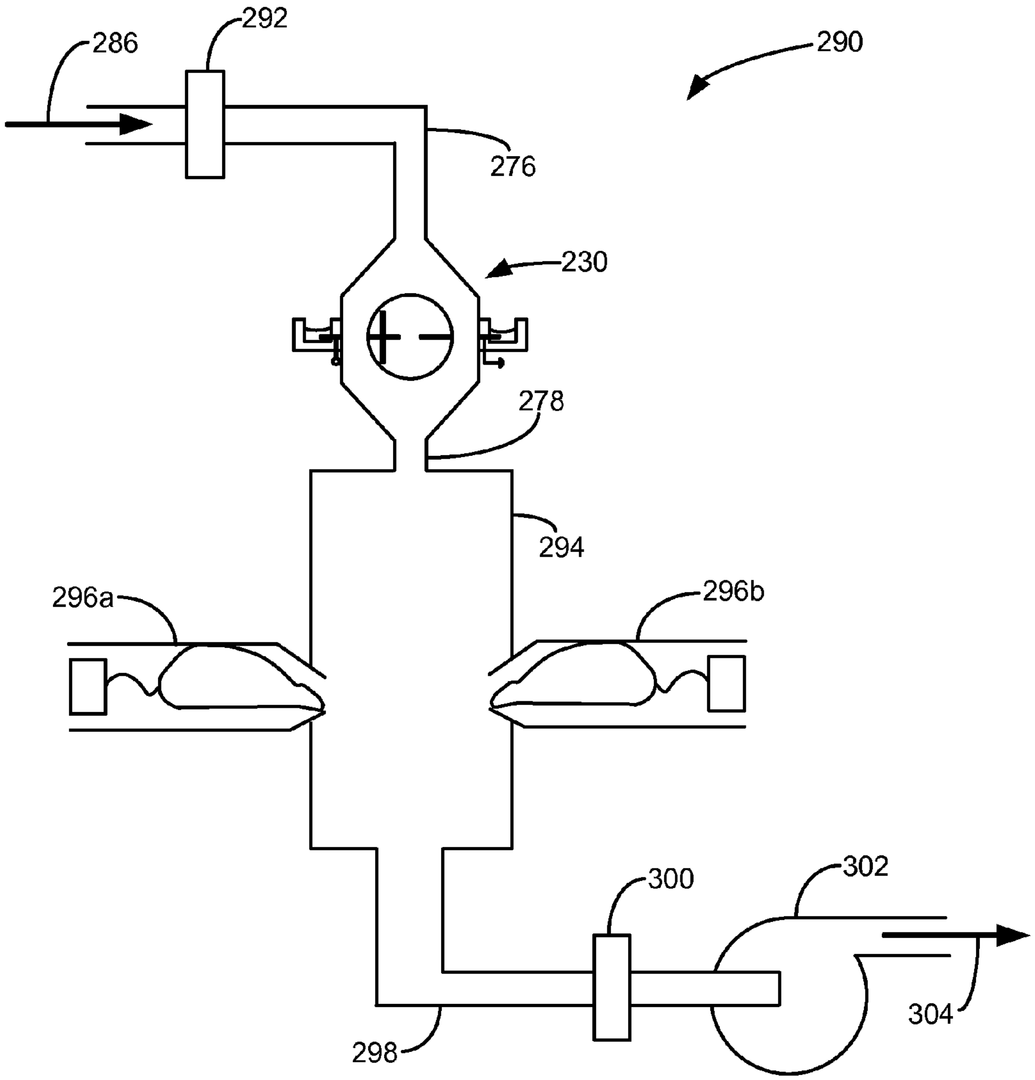
FIG. 4 is a side schematic illustration of an exemplary rodent inhalation system that includes the second embodied electrospray device of the present disclosure.

FIG. 4 illustrates system 290, which is an example of a suitable rodent inhalation system of the present disclosure that incorporates device 230, where device 230 is the same as device 130 (shown in FIG. 3). As shown in FIG. 4, system 290 also includes filter 292, exposure column 294, ports **296*a* and 296*b*, exhaust line 298, filter 300, and pump 302. Accordingly, device 230 may be mounted on top of exposure column 294, where exposure column 294 provides access to rodents retained in ports 296*a* and 296*b***.

A steady flow of air may be maintained through device 230 and exposure column 294 using pump 302. Filter 292 may be used to remove any pre-existing particles from the air, and filter 300 may be used to remove the generated nanoparticles flowing through exhaust line 298 before releasing the air to the ambient (as represented by arrow 304). The rodents or other suitable animals are able to breathe a suspension of the nanoparticle generated by device 230 with a high number density, such as in excess of $10^7$ particles per second. These nanoparticles may penetrate deep in the rodents' lungs to provide suitable results concerning efficacy and toxicity of test substances.

As discussed above, the electrospray devices of the present disclosure (e.g., devices 30, 130, and 230) do not apply opposite voltages on the pair of opposing needles, as would be intuitively perceived. Instead, each device incorporates an electrical field modifier to enable formation of liquid cones at the tips of both of the opposing needles. This reduces the complexity and cost of the neutralization process.

EXAMPLES

The present disclosure is more particularly described in the following examples that are intended as illustrations only, since numerous modifications and variations within the scope of the present disclosure will be apparent to those skilled in the art. Unless otherwise noted, all parts, percentages, and ratios reported in the following examples are on a weight basis, and all reagents used in the examples were obtained, or are available, from the chemical suppliers described below, or may be synthesized by conventional techniques.

Test runs were performed with an electrospray device of the present disclosure corresponding to device 130 (shown in FIG. 3), which incorporated an electrical field modifier. Air flow rates up to three liters/minute were tested, and operation of the device was not affected by the air flow rate. During operation, a voltage was applied to one of the pair of opposing needles, and the other needle was grounded. The voltage generated a first spray of charged droplets from the needle in contact with the electrical potential line and connected to the electric field modifier. Additionally, the electric field modifier successfully generated a second spray of charged droplets from the grounded needle, where the charged droplets had an opposite polarity of the first spray droplets. The droplets neutralized and coagulated to form nanoparticles that were suspended in the air flow to form an aerosol.

Figure 5:
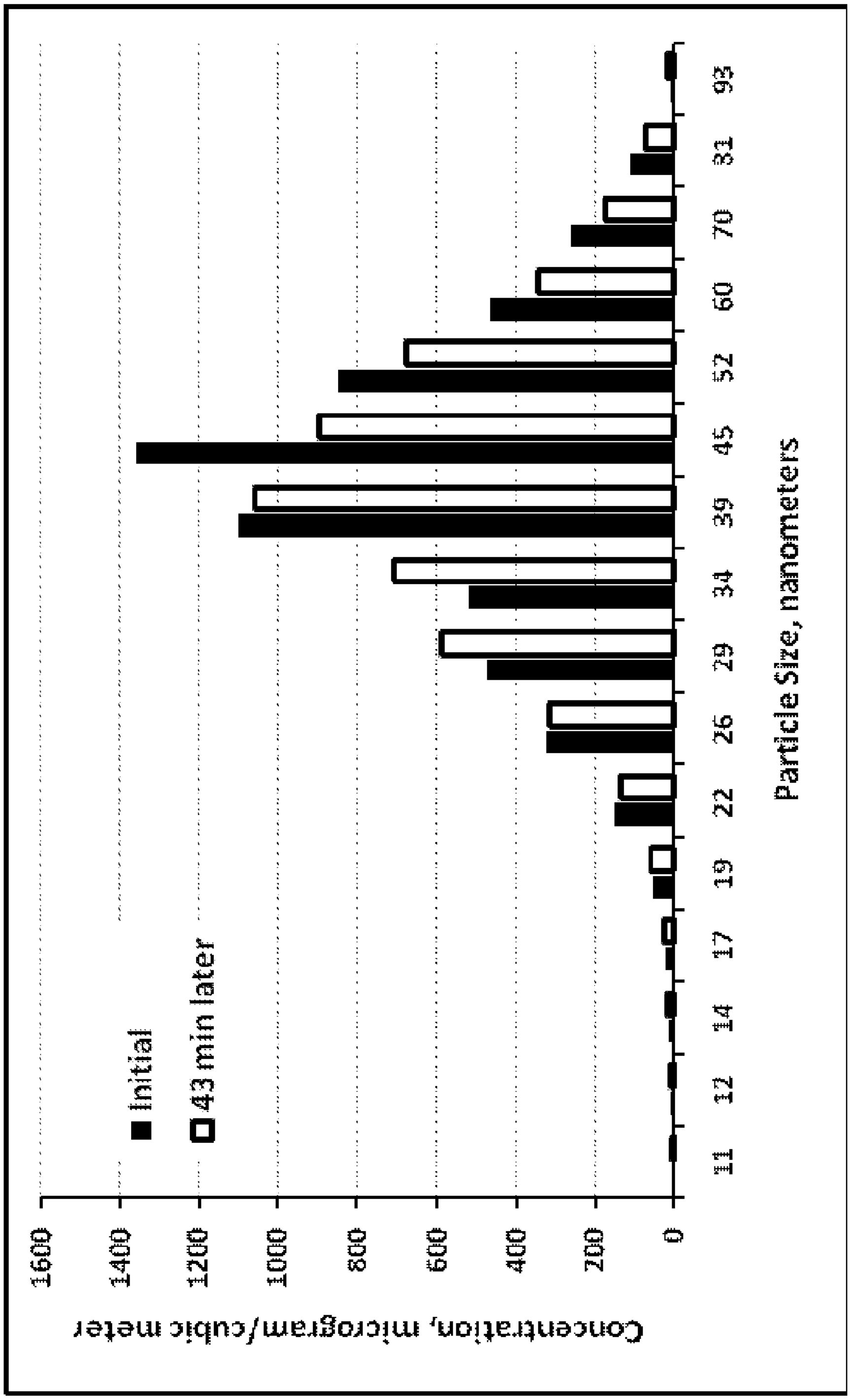
FIG. 5 is a graphical illustration of size distributions of nanoparticles generated with an example electrospray device of the present disclosure.

FIG. 5 illustrates the size distributions based on mass distributions of the generated nanoparticles that were measured shortly after startup and after a 43 minute period of continuous operation. The measurements were taken with an electromobility particle sizer commercially available under the trade designation "SMPS" spectrometer from TSI Inc., Shoreview, Minn. The aerosol concentration was $10^7$ particles per milliliter at an air flow rate of 0.5 liters/minute. Accordingly, the electric field modifier enabled the use of a single electrical potential (positive or negative) to generate oppositely charged droplets, thereby reducing the complexity and cost of the neutralization process.

Although the present disclosure has been described with reference to preferred embodiments, workers skilled in the art will recognize that changes may be made in form and detail without departing from the spirit and scope of the disclosure.

The invention claimed is:

1. A device for generating sprays of droplets, the device comprising:

a first needle connected to an electrical potential line, the electrical potential line being configured to apply a first voltage to the first needle to generate a first spray of charged particles from the first needle, the charged particles of the first spray having a first polarity;

a second needle spaced apart from and facing the first needle, the second needle being connected to an electrical line configured to ground the second needle or to apply a second voltage to the second needle that is the same polarity as the first voltage; and an electric field modifier connected to the first needle, the electric field modifier being configured to modify a generated electrical field produced by the applied voltage to generate a second spray of charged particles from the second needle, the charged particles of the second spray having a second polarity that is opposite of the first polarity.

2. The device of claim 1, wherein the first needle comprises a first tip, and wherein the electric field modifier is connected to the first needle at a location that is offset from the first tip by an offset distance ranging from about 2 millimeters to about 15 millimeters.

3. The device of claim 2, wherein the offset distance ranges from about 5 millimeters to about 10 millimeters.

4. The device of claim 1, wherein the first needle is spaced apart from the second needle by a distance ranging from about 2 millimeters to about 20 millimeters.

5. The device of claim 4, wherein the distance between the first needle and the second needle ranges from about 5 millimeters to about 10 millimeters.

6. The device of claim 1, wherein the electric field modifier comprises an annular metallic plate having an average diameter ranging from about 10 millimeters to about 50 millimeters.

7. The device of claim 6, wherein the average diameter ranges from about 20 millimeters to about 40 millimeters.

8. A device for generating sprays of droplets, the device comprising:

a first needle having a first inlet end configured to receive a first liquid, and a first tip opposite of the first inlet end;

an electrical potential line configured to apply a voltage to the first needle;

a metallic plate connected to the first needle at an offset distance from the first tip ranging from about 2 millimeters to about 15 millimeters;

a second needle having a second inlet end configured to receive a second liquid, and a second tip opposite of the second inlet end, the second tip of the second needle being spaced apart and facing the first tip of the first needle; and an electrical ground line configured to electrically ground the second needle.

9. The device of claim 8, wherein the offset distance ranges from about 5 millimeters to about 10 millimeters.

10. The device of claim 8, wherein the first tip of the first needle and the second tip of the second needle are spaced apart by a distance ranging from about 2 millimeters to about 20 millimeters.

11. The device of claim 10, wherein the distance between the first tip of the first needle and the second tip of the second needle ranges from about 5 millimeters to about 10 millimeters.

12. The device of claim 8, and further comprising:

a first reservoir configured to supply the first liquid to the first inlet end; and a second reservoir configured to supply the second liquid to the second inlet end.

13. The device of claim 12, wherein the first reservoir is configured to supply the first liquid to the first inlet end through hydrostatic pressure, and wherein the second reservoir is configured to supply the second liquid to the second inlet end through hydrostatic pressure.

14. The device of claim 8, and further comprising a pump configured to generate a gas flow across the first tip of the first needle and the second tip of the second needle.

15. A method for generating nanoparticles, the method comprising:

applying a voltage to a first needle to generate a first spray of charged droplets from the first needle, the charged droplets of the first spray having a first polarity;

electrically grounding a second needle while applying the voltage to the first needle, the second needle being spaced apart from and facing the first needle;

modifying an electrical field around the grounded second needle to generate a second spray of charged droplets from the grounded second needle, the charged droplets of the second spray having a second polarity that is opposite of the first polarity;

neutralizing the charged droplets of the first spray and the second spray to form neutralized droplets; and evaporating a solvent from the neutralized droplets to provide the nanoparticles.

16. The method of claim 15, and further comprising generating a gas flow across the first needle and the second needle.

17. The method of claim 16, and further comprising suspending the nanoparticles in the generated gas flow.

18. The method of claim 15, wherein the first needle and the second needle are spaced apart by a distance ranging from about 2 millimeters to about 20 millimeters.

19. The method of claim 15, wherein modifying the electrical field around the grounded second needle comprises providing a metallic plate connected to the first needle.

20. The method of claim 19, wherein the metallic plate is connected to the first needle at a location that is offset from a tip of the first needle by an offset distance ranging from about 2 millimeters to about 15 millimeters.

* * * * *